350-3.6 SR [redacted]
E197A XR 3,677,634

3,677,634
Mathisen [45] July 18, 1972

[54] CONTACTLESS MASK PATTERN EXPOSURE PROCESS AND APPARATUS SYSTEM HAVING VIRTUAL EXTENDED DEPTH OF FOCUS

[72] Inventor: Einar S. Mathisen, Poughkeepsie, N.Y.
[73] Assignee: International Business Machines Corporation, Armonk, N.Y.

[22] Filed: Dec. 23, 1968
[21] Appl. No.: 785,898

[52] U.S. Cl. ....................355/2
[51] Int. Cl. ....................G03b 27/28
[58] Field of Search ....................355/2

[56] References Cited

UNITED STATES PATENTS

| | | | |
|---|---|---|---|
| 3,530,442 | 9/1970 | Collier | 340/173 |
| 3,545,834 | 12/1970 | Gerritsen | 350/3.5 |
| 3,556,631 | 1/1971 | Cook | 350/3.5 |

*Primary Examiner*—John M. Horan
*Attorney*—Hanifin and Clark and Kenneth R. Stevens

[57] ABSTRACT

Forming a photoresist mask pattern by employing a three-dimensional mask having non-reflective passages. The mask pattern is recorded on a holographic plate to form a holographic pattern. Thereafter, the holographic pattern is spatially reconstructed so as to form a reconstructed radiation mask pattern having a virtual extended depth of focus defined by the mask entrance and exit images which is used to expose a photo-sensitized surface.

12 Claims, 9 Drawing Figures

PRIOR ART

INVENTOR
EINAR S. MATHISEN

BY Kenneth P. Stewart

ATTORNEY

CONTACTLESS MASK PATTERN EXPOSURE PROCESS AND APPARATUS SYSTEM HAVING VIRTUAL EXTENDED DEPTH OF FOCUS

SUMMARY OF THE INVENTION

In the past, photographic masks have been employed in order to selectively expose photo sensitive emulsions in the fabrication of an epitaxial-diffused integrated circuit. Generally, the photolithographic process is employed in the isolation and impurity diffusion steps. Normally, polymerization of the photosensitive emulsion is accomplished by contact mask exposure. That is, the mask having the desired pattern openings is placed in direct contact with the photo-sensitive emulsion, and then exposed to the appropriate radiation, for example, ultraviolet light.

Previously, it has been proposed to expose photosensitive emulsions by a non-contacting mask exposure system. In this system, an image or radiation pattern of the pattern consisting of opaque and transmitting areas is projected directly onto the photo-sensitive surface. This latter approach avoids many of the inherent disadvantages of contact printing from a master mask. These inherent disadvantages arise by virtue of problems relating to dust and other factors which prevent intimate contact between the print and the master mask causing image distortion due to diffraction. The photo-sensitized surface upon which the print is to be reproduced generally overlays either a semiconductor, an oxide on the semiconductor, or a metal film covering a conductor.

Some mask projection systems although avoiding many of the disadvantages of contact printing possess attendant problems and limitations which severely limit their use. In particular, present day mask projection systems require expensive lense arrangements; lack a high degree of resolution; and are limited in application by the size of the mask pattern area to be projected. Moreover and quite importantly, existing mask pattern projection systems are operative to produce a resulting image at a substantially single or shallow depth of focus distance. This latter limitation requires that the surface upon which the image is to be projected be positioned exactly at the image plane of the projection system. The photosensitized surface must coincide with the focal plane of the image to be projected, otherwise the surface will be exposed to a distorted image.

Thus, in accordance with well-known optic principles, known mask projection systems are required to sacrifice range or width of field for resolution. The art of holography possesses the general advantages of improving range or width of field while maintaining a higher degree of resolution otherwise impossible with a conventional non-holographic system having the same width of field.

In the past technical reasons dictate that for obtaining line width control, masks of both metal and emulsion coatings are fabricated of the thinnest possible dimension within the range of density required. As a result, most desirable and highly accurate mask exposure systems presently employ masks having a thickness of approximately 1,000 Angstroms. Thus, existing masks are effectively two dimensional in nature; although by virtue of our three-dimensional world the mask must possess some finite thickness. From this it can be seen that a substantially three-dimensional mask having a substantial finite thickness is an approach which is avoided in existing mask exposure systems.

The present invention uniquely employs a three-dimensional or substantially thick mask contrary to the direction of present day mask technology which attempts to provide extremely thin or substantially two-dimensional mask. Thus, a substantially thick mask in conjunction with a holographic exposure system provides unobvious results not previously expected or obtainable in prior art exposure systems. Moreover, it is known that in conventional holographic exposure systems a reconstructed image is often formed having grain defects or imperfections. One explanation for grain defects in the reconstructed image is that the defects result due to irregularities introduced in forming and developing the holographic plate, by virtue of non-recordability of the interference fringes, with available photographic emulsions. Also, speckling or grain defects is caused by the use of a coherent light source for construction and reconstruction of the hologram coupled with the use of a light diffuser. This results in a complex spatial interference pattern caused by the irregular wavefront radiated from the diffuser surface during the constructing or recording of the hologram. Accordingly, it can be seen that the exposure of a photosensitized surface to a reconstructed holographic image at a single or effectively single focal plane would result in the formation of grain irregularities on the photosensitized surface. However, substantial correction or elimination of this grain problem is possible by virtue of the advantages flowing from the present invention.

It is an object of the present invention to provide an improved holographic projection system having improved resolution, width of field, and virtual extended depth of focus.

It is a further object of the present invention to provide a mask exposure system which avoids the requirement for expensive and costly lense arrangements while improving resolution, width of field, and virtual extended depth of focus.

It is a further object of the present invention to provide a mask exposure system which eliminates rigid tolerance requirements relative to the positioning of a photosensitized surface with respect to a projected image.

It is a further object of the present invention to provide a holographic mask exposure system for projecting a higher resolution image onto a radiation or photosensitive surface coupled with compensation for grain irregularities inherent in the reconstructed holographic image.

It is another object of the present invention to provide a mask exposure system having improved virtual extended depth of focus for use in the fabrication of large scale integration circuits (L.S.I.).

SUMMARY OF THE INVENTION

The present invention provides method and apparatus for a projection system so as to improve resolution, width of field, and depth of focus comprising a holographic image recording and reconstructing system which employs a three-dimensional mask having substantial thickness. The three-dimensional mask comprises passageways having non-reflective surfaces and defined by entrance and exit openings normal to an axis of which is normal to the mask surface so as to result in a reconstructed image having virtual extended depth of focus. Formation of a reconstructed mask having virtual extended depth of focus and reciprocation of a photoresist surface within the virtual extended depth of focus improves definition of the image formed on the photoresist surface by compensating for grain defects in the reconstructed holographic image.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
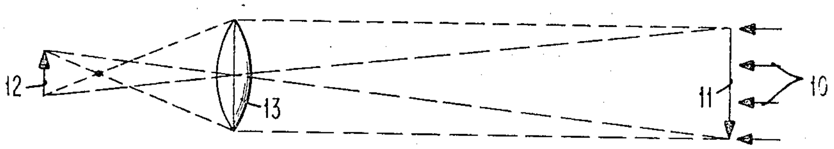
FIG. 1 illustrates a prior art lens projection system.
Figure 2:
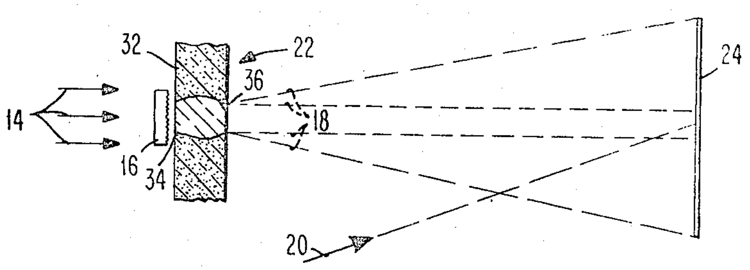
FIG. 2 illustrates the holographic recording of a three-dimensional mask pattern passageway in the mask exposure system.

Now, as shown in FIG. 1, the prior art lens projection system comprising a source of illumination 10 and an object 11 provides an image 12 whose field and resolution are severely limited by the optical characteristics of a lens 13, according to well known optical principles. In contradistinction, the present invention as shown in FIG. 2 provides a projection system particularly suited for use in mask exposure which overcomes the disadvantages of the prior art. The holographic system employs a monochromatic coherent laser source of light 14 directed at a diffuser 16. The recording process is accomplished by well-known holographic techniques in which a scattered wavefront 18 exiting from a master mask 22 is recorded photographically by superposing a coherent reference beam 20 on the wavefront 18 which strikes a photographic plate 24. The mask 22 defracts the incident radiation from the diffuser 16 to generate a field of complex magnitude and phase at the photographic plate 24. The reference beam 20 contributes a field with a uniform magnitude and a linear phase variation. The superposition of the reference beam 20 and the wavefront 18 results in a holographic pattern or hologram being recorded on the photographic plate 24. The photographic plate 24 is developed according to conventional holographic techniques.

A partial section of the mask is represented at 22 and includes only a single aperture or passageway 32; although it is to be readily understood that in an actual mask projection system the mask pattern would be far more complex than the simple pattern shown in the present invention for purposes of clarity in description. In the embodiment of FIG. 2, an extended depth of focus is provided by employing a substantially thick or three-dimensional mask 22 in the recording process. It is necessary that the internal walls or passageway surfaces defining the passageway 32 comprise a non-reflective surface. As applied to the present invention, non-reflective is intended to define a surface which is totally radiation absorbent for the particular source of radiation 14 which is being employed in the recording process. Likewise, a surface which possesses light trapping characteristics, such that it functions as a non-reflective surface, also is suitable. Similarly, object simulated techniques, analogue or digital, are suitable for the recording process.

The three-dimensional mask 22 includes entrance and exit openings 34 and 36, respectively. In the embodiment of FIG. 2, the internal tunnel or passageway 32 is formed of a surface which is absorbent to the incident beam radiation 14. Accordingly, the spatial distribution frequency of the wavefront 18 is defined in accordance with the entrance and exit aperture 34 and 36, respectively, and the thickness or depth of the tunnel 32.

Figure 3:
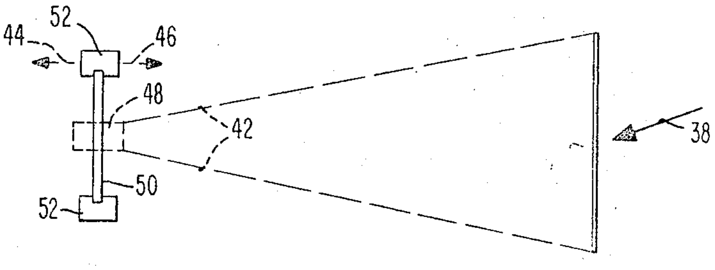
FIG. 3 illustrates the holographic reconstruction of the holographic pattern recorded in the apparatus illustrated in FIG. 2.

In FIG. 3, the reconstruction of a holographic image and the exposure of a radiation sensitive or photoresist surface is shown. The hologram or holographic pattern is stored on the photographic plate 24 in accordance with the recording process previously described with respect to FIG. 2. In order to reconstruct the original wavefront, the hologram is illuminated by wave 38 which is a conjugate wave of the original reference wavefront used for recording, according to conventional holographic techniques. As the plane wave 38 passes through the holographic plate 24, containing the holographic pattern of the three-dimensional masks 22, a conjugate wavefront 42 is generated. The conjugate wavefront actually forms a real image only at positions 44 and 46 corresponding to the entrance and exit apertures 34 and 36, respectively. However since a hologram has the inherent property of remembering the direction taken by the light or radiation employed in the recording process, the reconstructed wavefront contains a substantially solid radiation pattern portion 48 therebetween.

The lensless exposure of a photoresist or photosensitive emulsion surface employed in the fabrication of an integrated circuit is represented by the substrate member 50 positioned within the tunnel of light 48. In order to move the substrate 50 in a horizontal direction relative to the tunnel portion 48, the substrate 50 is held in a substrate holder and reciprocating tool, which tool is diagrammatically represented at 52. Accordingly, the substrate 50 is adapted to move in the direction of the arrows anywhere within the tunnel portion 48 as shown by the substrate indicated in dash lines when moved to the extreme positions 44 and 46.

Accordingly, it can be seen that the recording, reconstruction, and exposure operations provide a virtual extended depth of focus projection system which extends from position 44 to a position 46 in contradistinction to the prior art system illustrated in FIG. 1. It is not necessary to position a substrate at an exact focal plane in order to obtain a non-distorted mask pattern exposure on the photosensitive surface. Additionally, compensation for grain imperfections inherent in holographic systems is achievable since the substrate 50 is movable within the beam portion 48.

Figure 4A:
FIGS. 4A–4D illustrate the formation of a three-dimensional mask having non-reflective, radiation absorbing internal passageways for use in the holographic recording apparatus and method of FIG. 2.
Figure 4B:
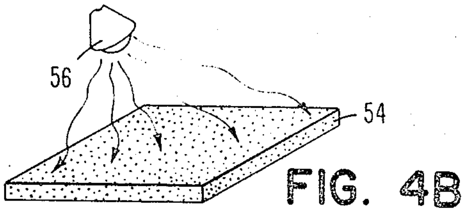
Figure 4C:
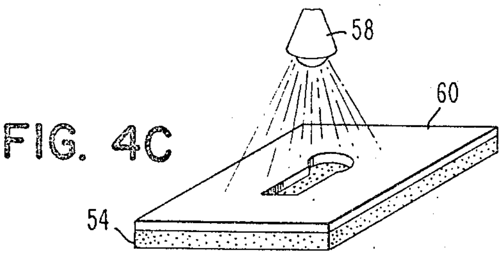
Figure 4D:
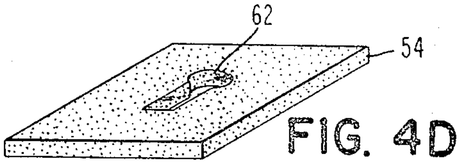

Now referring to FIGS. 4A–4D, a means for providing a three-dimensional mask having non-reflective internal passageways is shown. FIGS. 4A–4D illustrate the formation of a master mask for use in the recording process of FIG. 2 in which the internal passageway surfaces are radiation absorbing. A suitable photochromic glass body 54 is selected to satisfy the virtual extended depth of focus requirements necessary for the particular projection system. Photochromic glass changes transmittance reversibly under the action or influence of radiation. Photochromic glass contains silver halide crystals which darken when exposed to ultraviolet light in the 3,000–4,000 Angstrom region. Similarly, once the photochromic glass is darkened, selective erasing or bleaching is accomplished by heat or infrared light in the 6,000 Angstrom or longer wavelength region. In FIG. 4B the photochromic body 54 is darkened by exposure to ultraviolet light from a source 56. In FIG. 4C, writing or bleaching is accomplished by directing an infrared source of radiation 58 at the body 54, over which has been placed a bleaching mask 60, so as to expose only a desired portion of the photochromic body 54 to the infrared source of radiation 58. The resulting three-dimensional mask pattern formed from the photochromic body 54 having the desired light transmitting passage is shown in FIG. 4D. A non-reflective or light absorbing passageway surface is shown at 62.

Figure 5A:
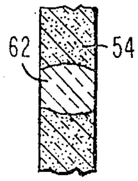
FIGS. 5A and 5B are cross-sectional, enlarged views of the mask shown in FIG. 4D with the addition of entrance and exit masks so as to compensate for irregularities which are capable of being formed in the process illustrated in FIGS. 4A–4D.
Figure 5B:
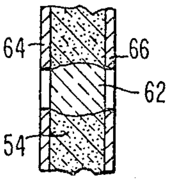

In the actual fabrication of the three-dimensional master mask it sometimes occurs that a resulting irregular passageway is formed due to light being defracted inwardly from the bleaching mask 60 during exposure or illumination to the source 58. As a result, the actual passage formed in the body 54 possesses a slightly enlarged and irregular configuration as illustrated in FIG. 5A. However, when employing a three-dimensional mask having light absorbing internal passage walls, no resulting distortion is created in the reconstructed image if the master mask illustrated in FIG. 5A is modified according to the principles shown in FIG. 5B. That is, a pair of entrance and exit masks 64 and 66, respectively, are joined to the body 54. The entrance and exit masks 64 and 66 are formed by conventional mask fabrication techniques. Their sole function is to exactly define the entrance and exit openings in accordance with the ultimate desired mask pattern. The fact that the internal passageway 62 is itself slightly enlarged in no way affects the reconstruction of the ultimate holographic system which is used to expose the substrate. In other words, an exact or non-distorted reconstructive holographic image results even though the recording process employs a three-dimensional mask having internal passageways which are of a slightly enlarged configuration. This advantage results by virtue of the fact that the holographic plate is exposed by a source radiation which is entirely defined by the entrance and exit mask 64 and 66 respectively. Incident radiation which strikes the irregularly formed internal passageway 62 during the recording process never reaches the photographic plate 24, since the wall 62 is radiation absorbing. Of course, if the process employed in forming the passageway or mask pattern in the body 54 is sufficiently exacting at the entrance and exit surfaces, then the master mask need not require the addition of the entrance and exit masks 64 and 66.

OPERATION OF THE PREFERRED EMBODIMENTS

Now referring to FIG. 2, it illustrates the principle of operation of the lenseless mask projection system which provides virtual extended depth of focus coupled with the attendant advantage of compensation for grain irregularities inherent in the formation of a reconstructed holographic image.

The recording process illustrated in FIG. 2 shows the formation of a holographic pattern on the photographic plate 24 by employing a thick-wall three-dimensional master mask 22 having an aperture or tunnel defined by a non-reflective surface 32. The non-reflective surface comprises a radiation absorbing surface which limits the spatial distribution frequency of the wavefront 18 leaving the exit aperture 36. In this instance, a predetermined field is recorded on the holographic plate 24.

Once the photographic plate has been developed it is then employed in the reconstruction and exposure system illustrated in FIG. 3. The holographic pattern contained on photographic plate 24 is illuminated by the conjugate source 38 of the original reference beam 20. The defracted beam 42 forms real images of the entrance and exit apertures at positions 44 and 46, respectively. Additionally, a solid pattern of radiation extends therebetween by virtue of the restrictive recording process employing a non-reflective, three-dimensional mask. Accordingly, the projection system provides a virtual extended depth of focus between the positions 44 and 46. It can be seen that if it were possible to view various planes of the radiation exposure pattern 48, each would contain random irregularities by virtue of grain effect. However, the exactness and resolution of the ultimate exposure of the photosensitive substrate 50 is improved by moving the substrate holder in a longitudinal direction as indicated by the arrows during the exposure of photo-sensitive material. In other words, grain defects capable of producing an irregular exposure of the photosensitive material at one plane will be exposed to a different irregular pattern at another plane. This action tends to completely expose the photosensitive surface voids which would have been left unexposed if the substrate 50 were maintained in a stationary position.

Although the present invention has been described with particular reference to a mask projection system it is to be understood that the principle of providing an extended depth of focus has wide application in many other fields.

While the invention has been particularly shown and described with reference to preferred embodiments thereof, it will be understood by those skilled in the art that various changes in form and details may be made therein without departing from the spirit and scope of the invention.

What is claimed is:

1. A method of providing virtual extended depth of focus for a holographic exposure system comprising the steps of:

a. directing a coherent source or radiation at a substantially thick, three-dimensional mask having at least one radiation transmitting passage, the passage being defined by radiation absorbing or trapping internal surface means and entrance and exit openings so as to expose the entrance opening to a complex wavefront source of radiation comprising a first component part diffracted by the entrance opening and also a second component part passing directly into the passage, the internal surface means absorbing or trapping that portion of the complex wavefront source of both the first and second component parts whose direction does not intercept the internal surface means so as to produce a resultant wavefront, the resultant wavefront comprising a third component part, the third component part comprising that portion of the first and second component parts whose direction does not intercept the internal surface means and any portion diffracted by the exit opening, b. recording the magnitude and phase of the resultant wavefront on a memory means so as to produce a holographic pattern, c. forming a spatial reconstructed radiation pattern from the holographic pattern, the virtual extended depth of focus being manifested by a tunnel of radiation during the step of forming a spatial reconstructed radiation pattern, the tunnel of radiation extending a distance defined by the distance separating the entrance and exit openings, and the cross-sectional tunnel area at any plane being defined by the size of the entrance and exit openings, and d. exposing a radiation sensitive means to the spatial reconstructed radiation pattern within the virtual extended depth of focus as defined by the entrance and exit real images.

2. A method of providing virtual extended depth of focus for a holographic exposure system comprising the steps of claim 1 and further including the step of:

a. forming the internal surface means of said mask of a radiation absorbing means.

3. A method of providing virtual extended depth of focus for a holographic exposure system comprising the steps of claim 2 and further including the step of:

a. moving the radiation sensitive means relative to the reconstructed radiation pattern so as to compensate for grain irregularities.

4. The method of forming a photoresist mask pattern in a holographic mask projection system comprising the steps of:

a. recording a holographic pattern of a resultant wavefront representing a substantially thick, three-dimensional mask having at least one light transmitting passage, the passage being defined by radiation absorbing or trapping internal surface means and entrance and exit openings by exposing the entrance opening to a complex wavefront source of radiation, the complex wavefront source of radiation comprising a first component part diffracted by the entrance opening and also a second component part passing directly into the passage, the internal surface means absorbing or trapping that portion of the complex wavefront source of both the first and second component parts whose direction does not intercept the internal surface means so as to produce a resultant wavefront, the resultant wavefront comprising a third component part, the third component part comprising that portion of the first and second component parts whose direction does not intercept the internal surface means and any portion diffracted by the exit opening.

b. reconstructing a radiation pattern from the holographic pattern, the radiation pattern including a real image of the entrance and exit openings and a virtual extended depth of focus extending between the entrance and exit openings, the virtual extended depth of focus being manifested by a tunnel of radiation during the step of reconstructing a radiation pattern, the tunnel of radiation extending a distance defined by the distance separating the entrance and exit openings, and the cross-sectional tunnel area at any plane being defined by the size of the entrance and exit openings, c. exposing a photosensitive surface to the reconstructed radiation pattern within the virtual extended depth of focus as defined by the real images of the entrance and exit openings.

5. The method in claim 4 further including the step of:

a. moving the photosensitive surface relative to the reconstructed radiation pattern so as to improve resolution due to grain irregularities, and b. said non-reflective internal surface means being radiation absorbent.

6. A method of providing virtual extended depth of focus for a holographic projection system of a mask comprising the steps of:

a. forming a reconstructed radiation pattern from a holographic pattern recording, b. the holographic pattern being recorded on a memory means and representing a substantially thick, three-dimensional mask having at least one radiation transmitting passage formed therethrough, and the passage being defined by radiation absorbing or trapping internal surface means and entrance and exit openings, c. exposing a photosensitive surface means to the reconstructed radiation pattern, the virtual extended depth of focus being manifested by an in-focus tunnel of radiation during the step of exposing a photosensitive surface means, the tunnel of radiation extending a distance defined by the distance separating the entrance and exit openings, and the cross-sectional tunnel area at any plane being defined by the size of the entrance and exit openings, and d. the radiation sensitive means being exposed within a portion of the reconstructed radiation pattern which is defined by the real images of the entrance and exit apertures.

7. The method as set forth in claim 6 further including the step of:

a. moving the photosensitive means relative to the reconstructed radiation pattern during the exposing step so as to compensate for grain irregularities in the reconstructed image.

8. A mask exposure system having virtual extended depth of focus comprising:

a. a memory means, b. said memory means having a holographic pattern stored therein, c. said holographic pattern representing a substantially thick, three-dimensional mask having at least one radiation transmitting passage, said passage representation being defined by radiation absorbing or trapping internal surface means and entrance and exit openings, d. exposure means for illuminating said memory means for forming a reconstructed radiation pattern, the reconstructed pattern comprising an in-focus tunnel of radiation extending a distance defined by the distance separating the entrance and exit openings, and the cross-sectional tunnel area at any plane being defined by the size of the entrance and exit openings, and e. support means for holding a photosensitive surface within a portion of the reconstructed radiation, the portion being defined by the real image of the entrance and exit openings, in order to expose the photosensitive surface.

9. A mask exposure system having virtual extended depth of focus as in claim 8 further including:

a. means for moving said support means relative to the reconstructed radiation pattern so as to compensate for grain irregularities.

10. A mask exposure system comprising:

a. memory means, b. said memory means having a holographic pattern stored therein, c. said holographic pattern representative of at least one radiation transmitting passage having substantially nonreflective surface means and entrance and exit openings, d. exposure means for illuminating the memory means for forming a reconstructed radiation pattern comprising a tunnel of radiation extending a distance defined by the distance separating the entrance and exit openings, and the cross-sectional tunnel area at any plane being defined by the size of the entrance and exit openings, and e. support means for holding a photosensitive surface within a portion of the tunnel of radiation, in order to expose the photosensitive surface.

11. A mask exposure system as in claim 10 further including:

means for moving the support means relative to the reconstructed radiation pattern so as to compensate for grain irregularities.

12. A method of providing virtual extended depth of focus for a holographic exposure system comprising the steps of:

a. directing a coherent source or radiation at a substantially thick, three-dimensional mask having at least one radiation transmitting passage, the passage being defined by radiation absorbing or trapping internal surface means and entrance and exit openings so as to expose the entrance opening to a complex wavefront source of radiation comprising a first component part diffracted by the entrance opening and also a second component part passing directly into the passage, the internal surface means absorbing or trapping that portion of the complex wavefront source of both the first and second component parts whose direction does not intercept the internal surface means so as to produce a resultant wavefront, the resultant wavefront comprising a third component part, the third component part comprising that portion of the first and second component parts whose direction does not intercept the internal surface means and any portion diffracted by the exit opening, and b. recording the magnitude and phase of the resultant wavefront on a memory means so as to provide a stored holographic pattern.

* * * * *